(12) United States Patent
Ohno

(10) Patent No.: US 10,858,758 B2
(45) Date of Patent: Dec. 8, 2020

(54) MANUFACTURING METHOD FOR SILICON CARBIDE EPITAXIAL WAFER AND MANUFACTURING METHOD FOR SILICON CARBIDE SEMICONDUCTOR DEVICE

(71) Applicant: Mitsubishi Electric Corporation, Tokyo (JP)

(72) Inventor: Akihito Ohno, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 16/473,554

(22) PCT Filed: Apr. 4, 2017

(86) PCT No.: PCT/JP2017/014130
§ 371 (c)(1),
(2) Date: Jun. 25, 2019

(87) PCT Pub. No.: WO2018/185850
PCT Pub. Date: Oct. 11, 2018

(65) Prior Publication Data
US 2020/0017991 A1   Jan. 16, 2020

(51) Int. Cl.
*C30B 29/36* (2006.01)
*C23C 16/455* (2006.01)
(Continued)

(52) U.S. Cl.
CPC .......... *C30B 29/36* (2013.01); *C23C 16/455* (2013.01); *C30B 25/18* (2013.01); *H01L 21/02378* (2013.01)

(58) Field of Classification Search
CPC . C30B 29/36; H01L 21/02378; H01L 21/205; H01L 29/1608; H01L 21/0262
See application file for complete search history.

(56) References Cited

U.S. PATENT DOCUMENTS 5,421,288 A   6/1995   Ohta et al.
7,081,420 B2 *  7/2006   Kamata .................. C30B 29/36
                                                    438/778
(Continued)

FOREIGN PATENT DOCUMENTS

JP   H06-232060 A   8/1994
JP   H08-236458 A   9/1996
(Continued)

OTHER PUBLICATIONS

International Search Report; Written Opinion; and Notification of Transmittal of the International Search Report and the Written Opinion of the International Searching Authority, or the Declaration issued in PCT/JP2017/014130; dated Jul. 4, 2017.
(Continued)

*Primary Examiner* — William Coleman
(74) *Attorney, Agent, or Firm* — Studebaker & Brackett PC

(57) ABSTRACT

A silicon carbide substrate (2) is positioned such that a principal surface of the silicon carbide substrate (2) is parallel to a plurality of injection holes (8) of a horizontal CVD apparatus arranged in a row. Source gas is fed from the plurality of injection holes (8) to epitaxially grow a silicon carbide epitaxial growth layer (10) on the principal surface of the silicon carbide substrate (2). The source gas fed from the plurality of injection holes (8) is divided into a plurality of system lines and controlled individually by separate mass flow controllers. A flow rate of the source gas on the principal surface of the silicon carbide substrate (2) is greater than 1 m/sec.

12 Claims, 3 Drawing Sheets

(51) Int. Cl.
    *C30B 25/18*     (2006.01)
    *H01L 21/02*     (2006.01)

(56) References Cited

U.S. PATENT DOCUMENTS

| | | | | |
|---|---|---|---|---|
| 7,147,714 B2 * | 12/2006 | Naito | ............. | C30B 25/02 |
| | | | | 117/84 |
| 7,651,668 B2 * | 1/2010 | Nakayama | ............. | B01J 8/008 |
| | | | | 422/132 |
| 8,941,122 B2 * | 1/2015 | Kawai | ............. | H01L 21/0455 |
| | | | | 257/302 |

FOREIGN PATENT DOCUMENTS

| | | |
|---|---|---|
| JP | 2005-235845 A | 9/2005 |
| JP | 2013-197507 A | 9/2013 |

OTHER PUBLICATIONS

Office Action issued in JP 2017-539376; mailed by the Japanese Patent Office dated Aug. 29, 2017.

\* cited by examiner

MANUFACTURING METHOD FOR SILICON CARBIDE EPITAXIAL WAFER AND MANUFACTURING METHOD FOR SILICON CARBIDE SEMICONDUCTOR DEVICE

FIELD

The present invention relates to a manufacturing method for a silicon carbide epitaxial wafer and a manufacturing method for a silicon carbide semiconductor device.

BACKGROUND

Silicon carbide semiconductor is attracting attention mainly as a material of power devices for power control in recent years since it is relatively large in all of bandgap, dielectric breakdown field intensity, saturated drift velocity and heat conductivity than silicon semiconductor. Such silicon carbide semiconductor devices can largely reduce a power loss and be downsized, and can realize energy saving in power supply conversion. Hence, they are key devices for realizing a low carbon society which allows high performance and the like of electric vehicles, highly functionalized solar cell systems and the like. Examples of the silicon carbide semiconductor devices include MOSFETs (Metal Oxide Semiconductor Field Effect Transistors), Schottky barrier diodes, IGBTs (Insulated Gate Bipolar Transistors), various diodes, and the like.

When a silicon carbide semiconductor device is manufactured, a silicon carbide epitaxial growth layer which is to be an active region for the semiconductor device is beforehand epitaxially grown on a silicon carbide bulk single crystal substrate by a thermal CVD method (thermal chemical vapor phase deposition method) or the like. The active region stated here is a sectional region, including the growth direction axis, which is formed under precise control of an impurity concentration in the crystal and a film thickness. The reason why such an epitaxial growth layer is needed is that while device specifications almost define the impurity concentration and the film thickness, precision of those is typically required to be higher than precision of those of a bulk single crystal substrate.

A wafer in which a silicon carbide epitaxial growth layer is epitaxially grown on a silicon carbide bulk single crystal substrate is hereinafter referred to as a silicon carbide epitaxial wafer. A silicon carbide semiconductor device is produced through various kinds of processing on the silicon carbide epitaxial wafer. There can be a case where the uptake amount of nitrogen used as a dopant in epitaxial growth of a silicon carbide epitaxial growth layer is not uniform in the wafer plane. A silicon carbide semiconductor device manufactured from a region in which a desired impurity concentration is not obtained causes a problem of decreasing a non-defective product rate in manufacturing silicon carbide semiconductor devices due to their incapability of holding high voltage or the similar situation. A cause of such non-uniformity of the uptake amount of nitrogen in the wafer plane can be, for example, that temperatures of a susceptor of an epitaxial growth apparatus are different in the peripheral part and the center part thereof, and therefore, concentrations of source gas flowing on the wafer are slightly different in the peripheral part and the center part.

As an epitaxial growth method for a silicon film excellent in film thickness distribution and resistivity distribution, there is disclosed a method of allowing source gas properly changing on the center part side and the peripheral part side in the width direction of a chamber to spout out from a plurality of injectors (for example, see PTL 1). Moreover, as an epitaxial growth method for a silicon film, there is also disclosed a method of allowing carrier gas in a streamline flow the gas flow rate of which is not less than 2 m/minute in a treating furnace to flow down (for example, see PTL 2).

CITATION LIST

Patent Literature

[PTL 1] JP H6-232060 A
[PTL 2] JP H8-236458 A

SUMMARY

Technical Problem

While the growth temperature of a silicon film is 1000 degrees to 1200 degrees, the growth temperature of a silicon carbide epitaxial growth layer is 1500 degrees to 1700 degrees, which is approximately 500 degrees of difference. Therefore, the concentration distribution of gas in the chamber and the temperature distribution of the susceptor caused by the decomposition efficiency of source gas are largely different therebetween. Accordingly, epitaxial growth of silicon carbide merely using the epitaxial growth method for a silicon film makes it difficult to make the wafer in-plane uniformity of the impurity concentration and the film thickness distribution compatible.

Moreover, control of the impurity concentration for silicon carbide semiconductor largely changes not only depending on flow rate control of nitrogen gas which is a dopant but also depending on the ratio between a silicon raw material and a carbon raw material. Accordingly, it is difficult to divert the conventional growth technology of a silicon film to growth of a silicon carbide epitaxial growth layer.

The present invention is devised in order to solve problems described above, and an object thereof is to obtain a manufacturing method for a silicon carbide epitaxial wafer capable of manufacturing an epitaxial wafer excellent in wafer in-plane uniformity of an impurity concentration, and a manufacturing method for a silicon carbide semiconductor device.

Solution to Problem

A manufacturing method for a silicon carbide epitaxial wafer according to the present invention includes: positioning a silicon carbide substrate such that a principal surface of the silicon carbide substrate is parallel to a plurality of injection holes of a horizontal CVD apparatus arranged in a row; and feeding source gas from the plurality of injection holes to epitaxially grow a silicon carbide epitaxial growth layer on the principal surface of the silicon carbide substrate, wherein the source gas fed from the plurality of injection holes is divided into a plurality of system lines and controlled individually by separate mass flow controllers, and a flow rate of the source gas on the principal surface of the silicon carbide substrate is greater than 1 m/sec.

Advantageous Effects of Invention

In the present invention, the source gas fed from the plurality of injection holes is divided into the plurality of system lines and controlled individually by the separate mass flow controllers, and the flow rate of the source gas on the principal surface of the silicon carbide substrate is greater than 1 msec. In this way, an epitaxial wafer excellent in wafer in-plane uniformity of the impurity concentration can be manufactured.

DESCRIPTION OF EMBODIMENTS

A manufacturing method for a silicon carbide epitaxial wafer and a manufacturing method for a silicon carbide semiconductor device according to the embodiments of the present invention will be described with reference to the drawings. The same components will be denoted by the same symbols, and the repeated description thereof may be omitted.

Embodiment 1

Figure 1:
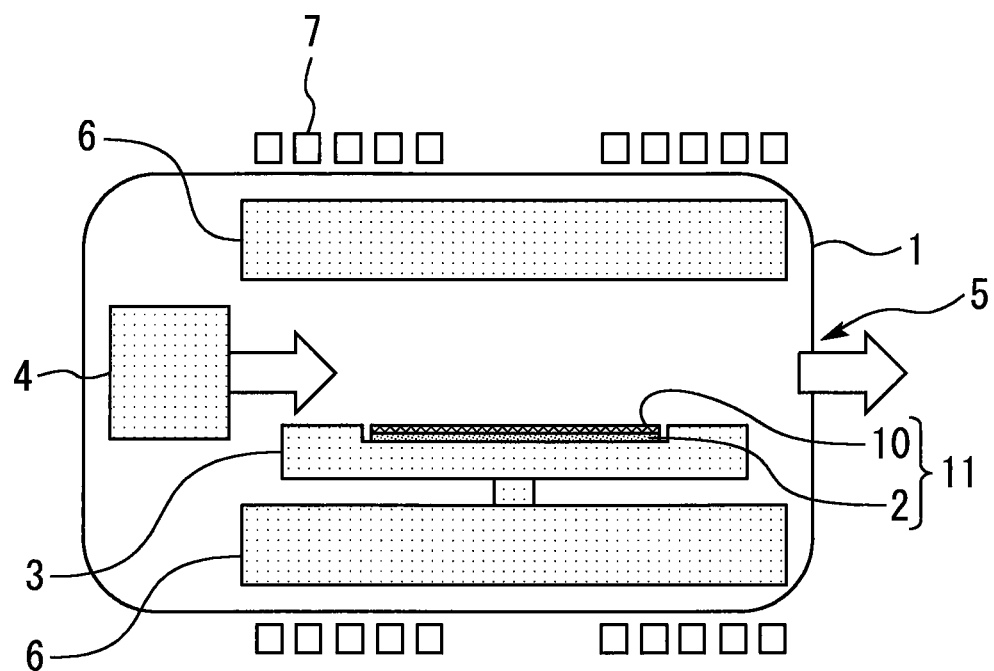
FIG. 1 is a cross-sectional view illustrating a manufacturing apparatus for a silicon carbide epitaxial wafer according to Embodiment 1 of the present invention.

FIG. 1 is a cross-sectional view illustrating a manufacturing apparatus for a silicon carbide epitaxial wafer according to Embodiment 1 of the present invention. A wafer holder 3 on which a silicon carbide substrate 2 is placed is provided in a growth furnace 1. The growth furnace 1 is a quartz tube. An injector 4 feeds source gas into the growth furnace 1. A gas discharge port 5 discharges the gas fed into the growth furnace 1 from the growth furnace 1. Susceptors 6 are provided above and below the wafer holder 3. An induction coil 7 is provided on the outside of the growth furnace 1.

Figure 2:
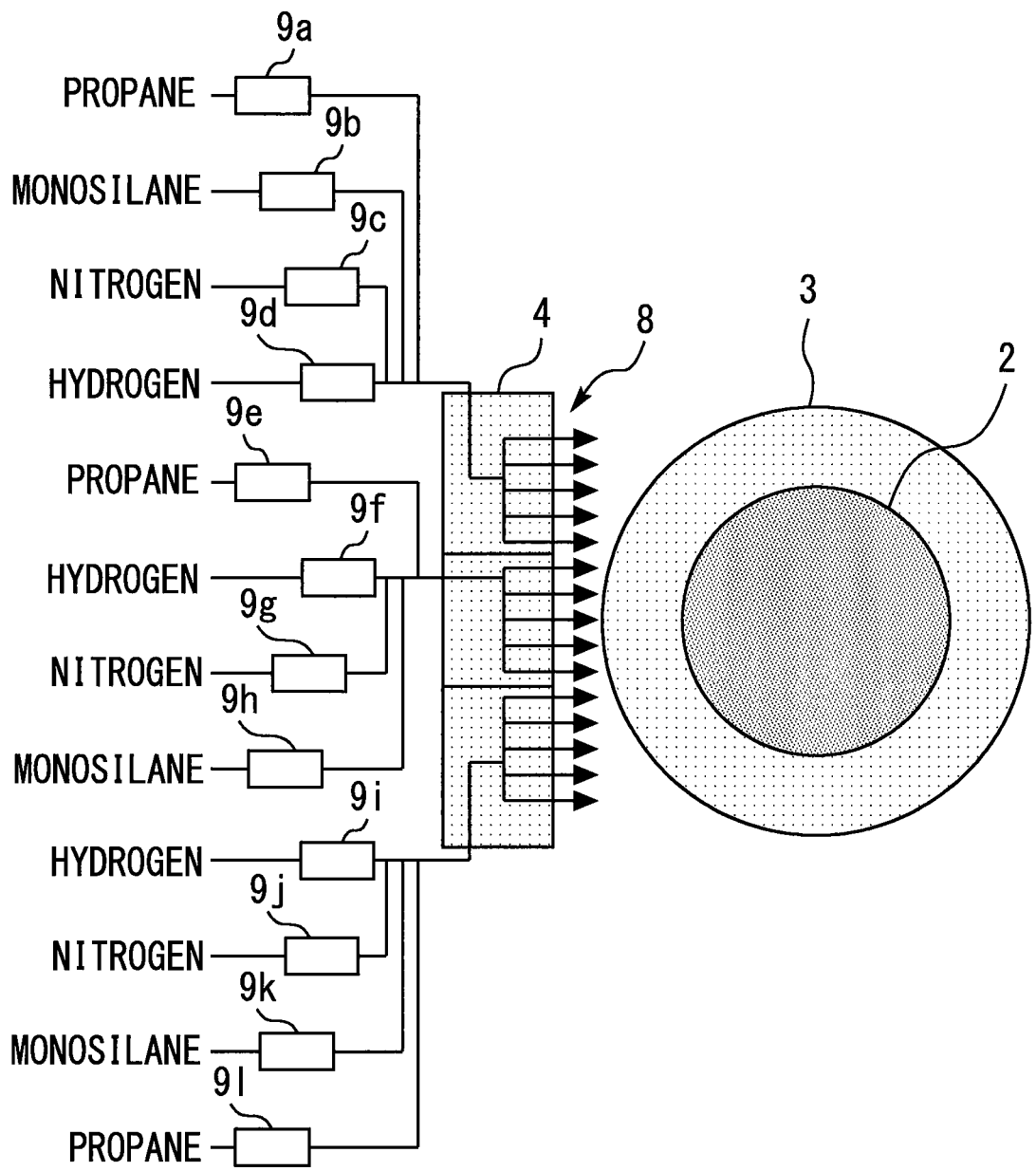
FIG. 2 is a top view illustrating the inside of the growth furnace.
Figure 3:
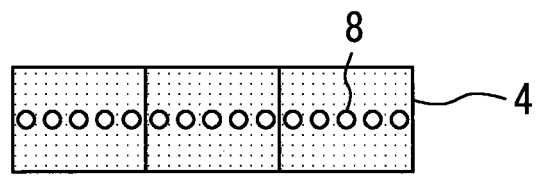
FIG. 3 is an elevational view illustrating the injector.

FIG. 2 is a top view illustrating the inside of the growth furnace. FIG. 3 is an elevational view illustrating the injector. A plurality of injection holes 8 having gas injection holes are arranged in a row in the injector 4. Propane gas, monosilane gas and nitrogen gas are fed from each injection hole 8. The injector 4 is divided into a plurality of system lines, and the source gas fed from the plurality of injection holes 8 is divided into system lines and controlled individually by separate mass flow controllers 9a to 9l. In the present embodiment, the injector 4 is divided into three system lines of a center part and two peripheral parts. Moreover, each fraction of source gas is diluted with hydrogen gas to be fed into the growth furnace 1.

Subsequently, a manufacturing method for a silicon carbide epitaxial wafer according to Embodiment 1 of the present invention is described. First, the silicon carbide substrate 2 that is a 4H-SiC bulk single crystal substrate with four degrees of off-angle in the <11-20> direction relative to the (0001) plane (C-plane) which becomes the principal surface is prepared. The silicon carbide substrate 2 undergoes flattening processing by chemical mechanical polishing using mechanical polishing and an acidic or alkaline liquid chemical. Next, organic substances are removed by ultrasonic cleaning using acetone. Next, the silicon carbide substrate 2 undergoes so-called RCA cleaning. Namely, after the silicon carbide substrate 2 is immersed in a mixed solution (1:9) of aqueous ammonia and aqueous hydrogen peroxide heated at 75 degrees (±five degrees) for ten minutes, it is immersed in hydrochloric acid and aqueous hydrogen peroxide (1:9) heated at 75 degrees (±five degrees). Furthermore, after the silicon carbide substrate 2 is immersed in an aqueous solution containing approximately 5% of hydrofluoric acid in volume ratio, it undergoes replacing processing with pure water. Herein, the silicon carbide substrate 2 is not limited to having four degrees of off-angle but may have one within a range of approximately two degrees to ten degrees and is sufficient to have undergone the flattening processing by chemical mechanical polishing.

Next, the silicon carbide substrate 2 is introduced in the growth furnace 1 of a horizontal CVD apparatus and placed on the wafer holder 3. The silicon carbide substrate 2 is positioned such that its principal surface is parallel to the plurality of injection holes 8 arranged in a row. Next, reducing gas, for example, hydrogen gas is introduced into the growth furnace 1. The hydrogen gas also functions as carrier gas. Next, pressure is controlled such that the degree of vacuum in the reactor is held to be constant, for example, at approximately 5 kPa. Next, the reactor is heated up to approximately 1650 degrees to perform annealing in a reducing gas atmosphere.

Next, the source gas is fed from the plurality of injection holes 8 to epitaxially grow a silicon carbide epitaxial growth layer 10 on the principal surface of the silicon carbide substrate 2 and to manufacture a silicon carbide epitaxial wafer 11. For the source gas, for example, silane gas ($SiH_4$) is used as a Si-raw material, and propane gas ($C_3H_8$) is used as a C-raw material. Nitrogen gas is used for N-type doping. The flow rate of $SiH_4$ gas fed from the injection holes 8 of the center part of the injector 4 is set to be 500 sccm, the flow rate of $C_3H_8$ gas 200 sccm, and the flow rate of nitrogen gas 10 sccm. The flow rate of $SiH_4$ a gas fed from each of the two peripheral parts of the injector 4 is set to be 500 sccm, the flow rate of $C_3H_8$ gas 200 sccm, and the flow rate of nitrogen gas 8 sccm. In this way, the silicon carbide epitaxial growth layer 10 is formed with 10 μm of film thickness. Moreover, the nitrogen gas is controlled such that impurity concentration is $8 \times 10^{15}/cm^3$ in the active region. In this stage, the flow rate of hydrogen which is the carrier gas is controlled such that the flow rate of the source gas on the principal surface of the silicon carbide substrate 2 is 1.18 m/s. After that, feed of the source gas is stopped, and the temperature is dropped to room temperature.

The impurity concentration of a silicon carbide epitaxial wafer that was manufactured was measured by a CV measurement apparatus to be extremely excellent with not more than 2% of wafer in-plane uniformity a/mean of the concentration of the impurity contained in the silicon carbide epitaxial growth layer 10 (ratio of the standard deviation relative to the average value of the impurity concentrations in the wafer plane). By manufacturing silicon carbide semiconductor devices using such a silicon carbide epitaxial wafer, the devices in high yield can be obtained.

Table 1 presents results obtained by investigating wafer in-plane uniformities of the impurity concentration in the occasion of the gas flow rate on a silicon carbide substrate being changed for a growth step of a silicon carbide epitaxial wafer. Here, the gas flow rate can be controlled by changing the flow rate of hydrogen as the carrier gas and/or by changing the pressure in the growth furnace 1. Moreover, "Good" designates cases of zero MOSFETs defective due to the impurity concentration deviating from its control value in the wafer plane, and "Poor" designates cases of non-zero defective one(s) in manufacturing MOSFETs using a silicon carbide epitaxial wafer.

TABLE 1

| Flow Rate[m/sec] | 0.60 | 0.95 | 1.18 | 1.78 |
|---|---|---|---|---|
| Wafer In-Plane Uniformity of Impurity Concentration | Poor | Poor | Good | Good |

Defect(s) arise when the gas flow rate is smaller than 1 m/s. The reason is estimated as that the source gas does not sufficiently reach the principal surface of the silicon carbide substrate 2 or that even if it reaches there, the gas is largely consumed on the upstream side in the growth furnace 1, and thereby, does not reach the vicinity of the center, which causes the wafer in-plane uniformity of the impurity concentration to deteriorate. On the other hand, by setting the gas flow rate to be greater than 1 m/s, the uniformity of the impurity concentration can be excellently controlled, which leads to zero defects with such deviation of the impurity concentration.

As described above, in the present embodiment, the source gas fed from the plurality of injection holes 8 is divided into the plurality of system lines and controlled individually by the separate mass flow controllers 9a to 9l, and the flow rate of the source gas on the principal surface of the silicon carbide substrate 2 is greater than 1 m/sec. In this way, an epitaxial wafer excellent in wafer in-plane uniformity of the impurity concentration can be manufactured.

Moreover, when the silicon carbide epitaxial growth layer 10 is epitaxially grown, the flow rate of the source gas fed from the plurality of injection holes 8 is preferably uniform. Thereby, the gas concentration in the growth furnace 1 can be easily controlled, and the wafer in-plane uniformity of the film thickness is improved. By adjusting the fed gas flow rate to match the number of injection holes 8, the flow rate of the source gas fed from the plurality of injection holes 8 can be made uniform.

Specifically, in the injector 4 of Embodiment 1, the center part has five injection holes 8 and each peripheral part has five injection holes 8. On the contrary, when the center part has nine injection holes 8 and each peripheral part has three injection holes 8, for example, for the center part, the flow rate of $SiH_4$ gas is set to be 900 sccm, the flow rate of $C_3H_8$ gas 360 sccm, and the flow rate of nitrogen gas 18 sccm. For the two places of the peripheral parts, the flow rate of $SiH_4$ gas is set to be 300 sccm, the flow rate of $C_3H_8$ gas 120 sccm, and the flow rate of nitrogen gas 4.8 sccm. In this manner, the flow rate of the fed gas coupled to the injector at the center part is set to be three times that at the peripheral part, and thereby, fractions of the gas flowing from the individual injection holes can be made uniform. Meanwhile, the like adjustment is sufficient to be applied also to the flow rate of hydrogen as the carrier gas.

Notably, while in the present embodiment, the injector 4 divided into three is used, the number of division is not limited to three but the similar effects can also be obtained with one divided, for example, into four or five. It should be noted that a large number of division causes an increase of gas system lines and also causes increases of the number of MFCs and the number of pipes, which results in a complex apparatus configuration, and therefore, the number of division is preferably not more than approximately ten at most.

Embodiment 2

A manufacturing method for a silicon carbide epitaxial wafer according to Embodiment 2 of the present invention is described. The manufacturing apparatus similar to that in Embodiment 1 is used. The flow rate of $SiH_4$ gas fed from the plurality of injection holes 8 from the center part of the injector 4 divided into three is set to be 500 sccm, the flow rate of $C_3H_8$ gas 200 sccm, and the flow rate of nitrogen gas 10 sccm. The flow rate of $SiH_4$ gas fed from each of the two peripheral parts of the injector 4 is set to be 500 sccm, the flow rate of $C_3H_8$ gas 220 sccm, and the flow rate of nitrogen gas 10 sccm. In this way, the silicon carbide epitaxial growth layer 10 is formed with 10 μm of film thickness. Moreover, the nitrogen gas is controlled such that impurity concentration is $8 \times 10^{15}/cm^3$ in the active region. In this stage, the flow rate of hydrogen which is the carrier gas is controlled such that the flow rate of the source gas on the principal surface of the silicon carbide substrate 2 is 1.18 m/s. The manufacturing method is otherwise similar to that in Embodiment 1.

The impurity concentration of a silicon carbide epitaxial wafer that was manufactured was measured by a CV measurement apparatus to be extremely excellent with not more than 2% of wafer in-plane uniformity 6/mean of the impurity concentration. By manufacturing silicon carbide semiconductor devices using such a silicon carbide epitaxial wafer, the devices in high yield can be obtained.

In Embodiment 1, the flow rate of nitrogen gas which is impurity source gas is adjusted with the center part and the peripheral parts of the injector 4 divided into three. On the contrary, in Embodiment 2, the flow rate of $C_3H_8$ gas which is carbon source gas is adjusted with the center part and the peripheral parts. As the control method of the impurity concentration, there is herein adopted a technique of adjusting the doping efficiency of nitrogen in the wafer plane in accordance with the ratio between the silicon source gas and the carbon source gas. Also in this case, the wafer in-plane uniformity of the impurity concentration can be adjusted. Moreover, fixation of the flow rate of $SiH_4$ gas which is silicon source gas is preferable since it allows the wafer in-plane uniformity of the film thickness to be easily controlled.

Embodiment 3

Figure 4:
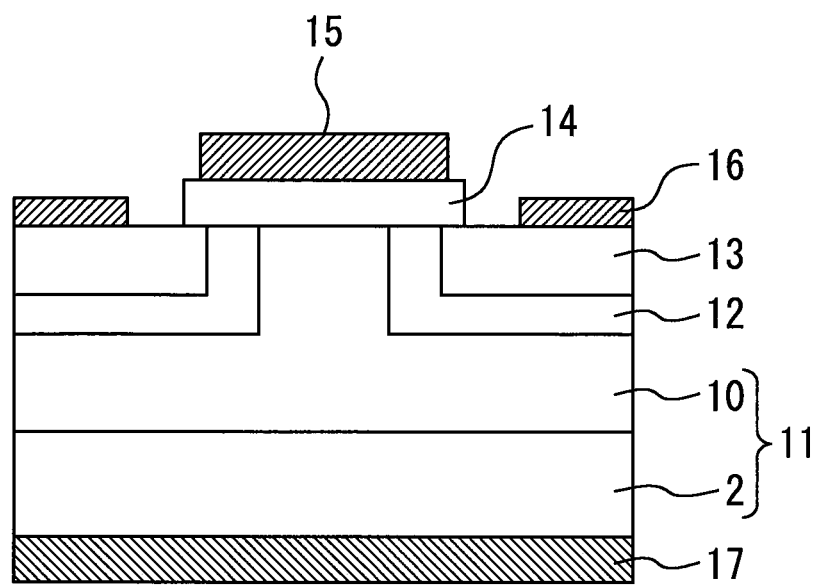
FIG. 4 is a cross-sectional view illustrating a silicon carbide semiconductor device according to Embodiment 3 of the present invention.

FIG. 4 is a cross-sectional view illustrating a silicon carbide semiconductor device according to Embodiment 3 of the present invention. This device is a MOSFET manufactured using the silicon carbide epitaxial wafer 11 manufactured by the method according to Embodiment 1 or 2.

A plurality of p-type base regions 12 are formed by selectively doping the surface layer of the silicon carbide epitaxial growth layer 10 with aluminum as a p-type impurity. n-Type source regions 13 are formed by doping the surface layers of the p-type base regions 12 with nitrogen as an n-type impurity. A gate insulating film 14 composed of silicon oxide is formed partially on the silicon carbide epitaxial growth layer 10, the p-type base regions 12 and the n-type source regions 13. A gate electrode 15 is formed in a region of the silicon carbide epitaxial growth layer 10 sandwiched by a pair of n-type source regions 13 so as to face it via the gate insulating film 14. Source electrodes 16 are formed on the n-type source regions 13 that are not formed with the gate insulating film 14. A drain electrode 17 is formed on the rear surface of the silicon carbide substrate 2.

Since the silicon carbide epitaxial wafer 11 manufactured by the method according to Embodiment 1 or 2 is excellent in wafer in-plane uniformity of the impurity concentration, MOSFETs can be manufactured in high device yield.

Embodiment 4

Figure 5:
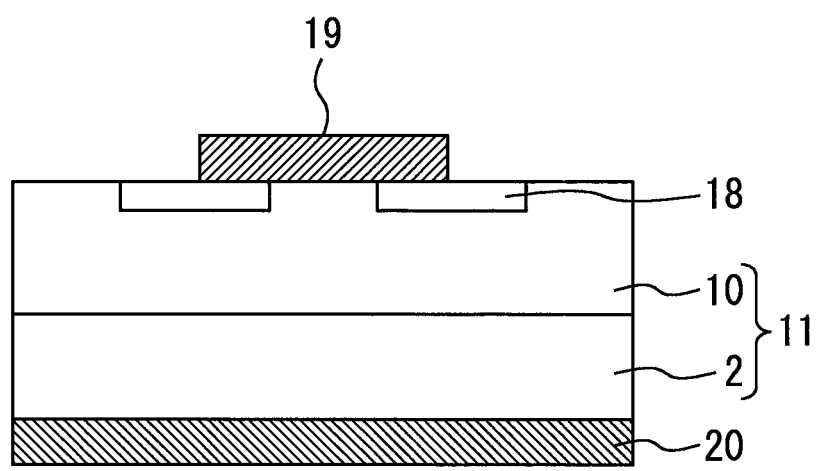
FIG. 5 is a cross-sectional view illustrating a silicon carbide semiconductor device according to Embodiment 4 of the present invention.

FIG. 5 is a cross-sectional view illustrating a silicon carbide semiconductor device according to Embodiment 4 of the present invention. This device is a Schottky barrier diode manufactured using the silicon carbide epitaxial wafer 11 manufactured by the method according to Embodiment 1 or 2.

A plurality of ion implantation regions 18 are formed by selectively doping the surface layer of the silicon carbide epitaxial growth layer 10 with aluminum as a p-type impurity. A Schottky electrode 19 is formed across on a region of the silicon carbide epitaxial growth layer 10 sandwiched by the ion implantation regions 18 and on parts of the ion implantation regions 18. An ohmic electrode 20 is formed on the rear surface of the silicon carbide substrate 2.

Since the silicon carbide epitaxial wafer 11 manufactured by the method according to Embodiment 1 or 2 is excellent in wafer in-plane uniformity of the impurity concentration, Schottky barrier diodes can be manufactured in high device yield.

While some embodiments of the present invention have been above disclosed and described in detail, the aforementioned description exemplifies some aspects which the present invention can apply to and the present invention is not limited to these. Such embodiments of the present invention can be freely combined and properly modified and/or simplified within the scope of the invention.

REFERENCE SIGNS LIST 2 silicon carbide substrate; 8 injection hole; 10 silicon carbide epitaxial growth layer

The invention claimed is:

1. A manufacturing method for a silicon carbide epitaxial wafer comprising:
    positioning a silicon carbide substrate between an injector and a gas discharge port, such that gas from the injector flows along a principal surface of the silicon carbide substrate to the gas discharge port, defining a gas flow direction, the injector including a plurality of injection holes arranged along an alignment direction that is perpendicular to the gas flow direction and parallel to the principal surface of the silicon carbide substrate; and
    an epitaxial growth step of feeding source gas and carrier gas from the plurality of injection holes to epitaxially grow a silicon carbide epitaxial growth layer on the principal surface of the silicon carbide substrate, wherein
    the source gas and the carrier gas fed from the plurality of injection holes is divided into a plurality of system lines and controlled individually by separate mass flow controllers, each system line being configured to supply each of the source gas and the carrier gas,
    the plurality of system lines includes a first system line and a second system line,
    a total flow rate of the source gas fed from one of the injection holes connected to the first system line is different from a total flow rate of the source gas fed from one of the injection holes connected to the second system line,
    flow rates of the source gas and the carrier gas are adjusted in accordance with a number of the injection holes for each of the system lines so that the flow rates of the source gas and the carrier gas fed from the plurality of injection holes in the epitaxial growth step is uniform, and
    a flow rate of the source gas on the principal surface of the silicon carbide substrate is greater than 1 m/sec.

2. The manufacturing method for a silicon carbide epitaxial wafer according to claim 1, wherein
    a flow rate of the source gas is adjusted for each of the plurality of system lines so that wafer in-plane uniformity of an impurity concentration contained in the silicon carbide epitaxial growth layer is not more than 2%.

3. A manufacturing method for a silicon carbide semiconductor device manufacturing a silicon carbide semiconductor device using a silicon carbide epitaxial wafer manufactured by the method according to claim 1.

4. The manufacturing method for a silicon carbide epitaxial wafer according to claim 2, wherein a flow rate of impurity source gas is adjusted for each of the plurality of system lines.

5. The manufacturing method for a silicon carbide epitaxial wafer according to claim 2, wherein a flow rate of carbon source gas is adjusted for each of the plurality of system lines.

6. A manufacturing method for a silicon carbide epitaxial wafer comprising:
    positioning a silicon carbide substrate between an injector and a gas discharge port of a growth furnace, such that gas from the injector flows along a principal surface of the silicon carbide substrate to the gas discharge port, defining a gas flow direction, the injector including a plurality of injection holes arranged along an alignment direction that is perpendicular to the gas flow direction and parallel to the principal surface of the silicon carbide substrate; and
    an epitaxial growth step of feeding source gas and carrier gas from the plurality of injection holes to epitaxially grow a silicon carbide epitaxial growth layer on the principal surface of the silicon carbide substrate, wherein
    the source gas fed from the plurality of injection holes is divided into a plurality of system lines and controlled individually by separate mass flow controllers, each system line being configured to supply each of the source gas and the carrier gas,
    flow rates of the source gas and the carrier gas are adjusted in accordance with a number of the injection holes for each of the system lines so that the flow rates of the source gas and the carrier gas fed from the plurality of injection holes in the epitaxial growth step is uniform,
    a flow rate of the source gas on the principal surface of the silicon carbide substrate is greater than 1 m/sec,
    a flow rate of the source gas is adjusted for each of the plurality of system lines so that wafer in-plane uniformity of an impurity concentration contained in the silicon carbide epitaxial growth layer is not more than 2%,
    a flow rate of carbon source gas is adjusted for each of the plurality of system lines, and
    a flow rate of silicon source gas is fixed.

7. A manufacturing method for a silicon carbide semiconductor device manufacturing a silicon carbide semiconductor device using a silicon carbide epitaxial wafer manufactured by the method according to claim 6.

8. A manufacturing method for a silicon carbide epitaxial wafer comprising:

positioning a silicon carbide substrate between an injector and a gas discharge port of a growth furnace, such that gas from the injector flows along a principal surface of the silicon carbide substrate to the gas discharge port, defining a gas flow direction, the injector including a plurality of injection holes arranged along an alignment direction that is perpendicular to the gas flow direction and parallel to the principal surface of the silicon carbide substrate; and an epitaxial growth step of feeding source gas and carrier gas from the plurality of injection holes to epitaxially grow a silicon carbide epitaxial growth layer on the principal surface of the silicon carbide substrate, wherein the source gas fed from the plurality of injection holes is divided into a plurality of system lines and controlled individually by separate mass flow controllers, each system line being configured to supply each of the source gas and the carrier gas, the plurality of system lines includes a first system line and a second system line, a number of the injection holes connected to the first system line is different from a number of the injection holes connected to the second system line, flow rates of the source gas and the carrier gas are adjusted in accordance with a number of the injection holes for each of the system lines so that the flow rates of the source gas and the carrier gas fed from the plurality of injection holes in the epitaxial growth step is uniform, and a flow rate of the source gas on the principal surface of the silicon carbide substrate is greater than 1 m/sec.

9. The manufacturing method for a silicon carbide epitaxial wafer according to claim 8, wherein a flow rate of the source gas is adjusted for each of the plurality of system lines so that wafer in-plane uniformity of an impurity concentration contained in the silicon carbide epitaxial growth layer is not more than 2%.

10. A manufacturing method for a silicon carbide semiconductor device manufacturing a silicon carbide semiconductor device using a silicon carbide epitaxial wafer manufactured by the method according to claim 8.

11. The manufacturing method for a silicon carbide epitaxial wafer according to claim 9, wherein a flow rate of impurity source gas is adjusted for each of the plurality of system lines.

12. The manufacturing method for a silicon carbide epitaxial wafer according to claim 9, wherein a flow rate of carbon source gas is adjusted for each of the plurality of system lines.

* * * * *